(12) United States Patent  
Mukai et al.

(10) Patent No.: US 6,639,254 B2
(45) Date of Patent: Oct. 28, 2003

(54) EPITAXIAL LAYER CAPABLE OF EXCEEDING CRITICAL THICKNESS

(75) Inventors: Koki Mukai, Kawasaki (JP); Mitsuru Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 09/756,294

(22) Filed: Jan. 9, 2001

(65) Prior Publication Data

US 2001/0011733 A1 Aug. 9, 2001

(30) Foreign Application Priority Data

Jan. 31, 2000 (JP) .................................. 2000-021684
Sep. 13, 2000 (JP) .................................. 2000-278638

(51) Int. Cl.$^7$ ............................................ H01L 31/0304
(52) U.S. Cl. ...................... 257/190; 257/97; 257/103
(58) Field of Search ............................. 257/190, 103, 257/97

(56) References Cited

U.S. PATENT DOCUMENTS 5,608,229 A * 3/1997 Mukai ........................ 257/17
5,751,753 A * 5/1998 Uchida ...................... 257/190

* cited by examiner

Primary Examiner—Jerome Jackson
(74) Attorney, Agent, or Firm—Armstrong, Westerman & Hattori, LLP

(57) ABSTRACT

A substrate has a principal surface exposing a first semiconductor material. A micro structure is disposed on the principal surface of the substrate. The micro structure is made of a second semiconductor material having a lattice constant different from a lattice constant of the first semiconductor material, and defines a three-dimensionally irregular upper surface. A strained layer is disposed on the micro structure. The strained layer is made of a third semiconductor material having a lattice constant different from a lattice constant of the first semiconductor material. A semiconductor device is provided which has the structure allowing to form a high quality strained layer in terms of crystallography.

20 Claims, 9 Drawing Sheets

STRAINED InGaAs (ACTIVE LAYER)

p-GaAs (0.5 μm)
p-InGaP (1.0 μm)
GaAs
n-InGaP (1.0 μm)
n-GaAs-sub

EPITAXIAL LAYER CAPABLE OF EXCEEDING CRITICAL THICKNESS

This application is based on Japanese Patent Applications 2000-278638, filed on Sep. 13, 2000, and 2000-21684 filed on Jan. 31, 2000, the entire contents of which are incorporated herein by reference.

BACKGROUND OF THE INVENTION a) Field of the Invention

The present invention relates to a semiconductor device and a semiconductor laser, and more particularly to a semiconductor device in which a strained layer is formed on a substrate having a semiconductor surface, the stained layer being made of semiconductor material having a lattice constant different from that of the semiconductor surface.

b) Description of the Related Art

Developments on semiconductor crystal growth methods typically organo-metal or metal organic vapor phase epitaxy (MOVPE) and molecular beam epitaxy (MBE) have made it possible to grow a semiconductor layer on a substrate, the semiconductor layer having a lattice constant different from that of the substrate and containing strain.

A strain amount or film thickness of a strained layer to be used in a semiconductor device has a critical value. This critical value is called a critical strain amount or critical film thickness. Misfit (crystal) dislocations occur if a strain stress exceeds an elastic limit specific to each kind of crystal, and lower the performance of the semiconductor device. Even if there is no misfit dislocation immediately after the manufacture of semiconductor devices, misfit dislocations may occur by a thermal history or the like after the long term use. A sufficient margin of the critical strain amount or film thickness is required in order to improve the reliability of semiconductor devices.

These limits in the strain amount or film thickness of a strained layer restrict the design of semiconductor devices such as strained quantum well semiconductor lasers and high electron mobility transistors (HEMT). Techniques of suppressing the generation of vacancies in a strained layer by using a graded substrate are disclosed, for example, in JP-A-7-312461. The effects of these techniques, however, are considered unsatisfactory.

From the restrictions of lattice constant, an InP substrate is generally used for a semiconductor laser using an InGaAsP strained quantum well and oscillating at a wavelength of 1.3 $\mu$m. If a GaAs substrate is used, although the good temperature characteristics at a higher temperature can be expected, the necessary strain amount in the InGaAsP strained layer exceeds the critical value. It has been therefore difficult to use a GaAs substrate for an InGaAsP semiconductor laser.

A blue semiconductor laser uses $In_{0.12}Ga_{0.88}N$ and $In_{0.03}Ga_{0.97}N$ as the materials of a well layer and a barrier layer in a multiple quantum well (MQW) structure and GaN as the material of a light confinement layer. A substrate lattice-matching with these materials is not known and it is inevitable to use a strained layer. Designs are therefore restricted by the critical strain.

SUMMARY OF THE INVENTION

It is an object of the present invention to provide a semiconductor device having a structure allowing to form a high quality strained layer in terms of crystallography.

According to one aspect of the present invention, there is provided a semiconductor device comprising: a substrate having a principal surface exposing a first semiconductor material; a micro structure disposed on the principal surface of the substrate, the micro structure being made of a second semiconductor material having a lattice constant different from a lattice constant of the first semiconductor material, and defining a three-dimensionally irregular upper surface; and a strained layer disposed on the micro structure, the strained layer being made of a third semiconductor material having a lattice constant different from the lattice constant of the first semiconductor material.

Since the micro structure is disposed between the strained layer and substrate, the strained layer can be grown to be thicker than a critical film thickness. The reason for this may be ascribed to that the micro structure forms a variation in the directions of vectors of a strain stress in the strained layer.

According to another aspect of the present invention, there is provided a semiconductor device comprising: an underlying substrate made of semiconductor material, the underlying substrate having irregular in-plane lattice constants on an upper surface of the underlying substrate; and a strained layer formed on the upper surface of the underlying substrate, the strained layer being made of semiconductor material and containing strain.

Since the in-plane lattice constants on the upper surface of the underlying substrate are irregular, there is a variation in the directions of vectors of a strain stress in the strained layer.

According to another aspect of the present invention, there is provided a semiconductor laser comprising: a substrate made of semiconductor material of a first conductivity type; a micro structure disposed on the substrate, the micro structure having irregular in-plane lattice constants on an upper surface of the micro structure; a strained active layer disposed on the micro structure, the strained active layer being made of semiconductor material and containing strain; a clad layer formed on the strained active layer, the clad layer being made of semiconductor material of a second conductivity type opposite to the first conductivity type, the semiconductor material of the second conductivity type having a lattice constant equivalent to a lattice constant of the substrate; and electrodes for allowing a current to flow between said substrate and said clad layer.

Since the micro structure is disposed between the substrate and the strained layer, the strained active layer can be grown to be thicker than the critical film thickness. As the strained active layer is made thick, the emission wavelength becomes long. Therefore, the degree of freedom of selecting an emission wavelength can be increased.

According to another aspect of the present invention, there is provided a semiconductor device comprising: a substrate having a principal surface exposing a first semiconductor material; an underlying layer disposed on the principal surface of the substrate, the underlying layer being made of a second semiconductor material containing In, the second semiconductor material having a lattice constant which lattice-matches a lattice constant of the first semiconductor material in a range of 1% or lower; and a strained semiconductor layer disposed on the underlying layer, the strained semiconductor layer being made of a third semiconductor material having a lattice constant different from a lattice constant of underlying semiconductor material.

In is segregated on the surface of the layer containing In. A semiconductor film thicker than the critical film thickness can be grown on the In containing layer without generating misfit dislocations.

For example, a micro structure or a semiconductor layer including In is disposed between an underlying substrate and a strained layer. When the micro structure or the semiconductor layer including In is disposed, the strained layer can be grown thicker than a strained layer directly grown on the underlying substrate. Therefore, design freedom of the semiconductor device using a strained layer can be improved. More reliable semiconductor device can be obtained.

DETAILED DESCRIPTION OF THE PREFERRED EMBODIMENTS

At first, a critical film thickness $h_c$ at which misfit dislocations occur by strain when a crystal layer is grown on an underlying crystal layer having a different lattice constant, is defined by the following equation derived by J. W. Matthews & A. E. Blakeslee, ("J. Crystal Growth" vol. 27, p. 118, 1974):

$$h_c = \frac{b}{2\pi f} \frac{(1 - v\cos^2\alpha)}{(1 + v)\cos\lambda}\left(\ln\frac{h_c}{b} + 1\right)$$

where v is a Poisson's ratio, b is a magnitude of a Burgers vector, λ is an angle between the slide direction of dislocation and growth plane, and α is an angle between a Burgers vector and a dislocation line.

Figure 6:
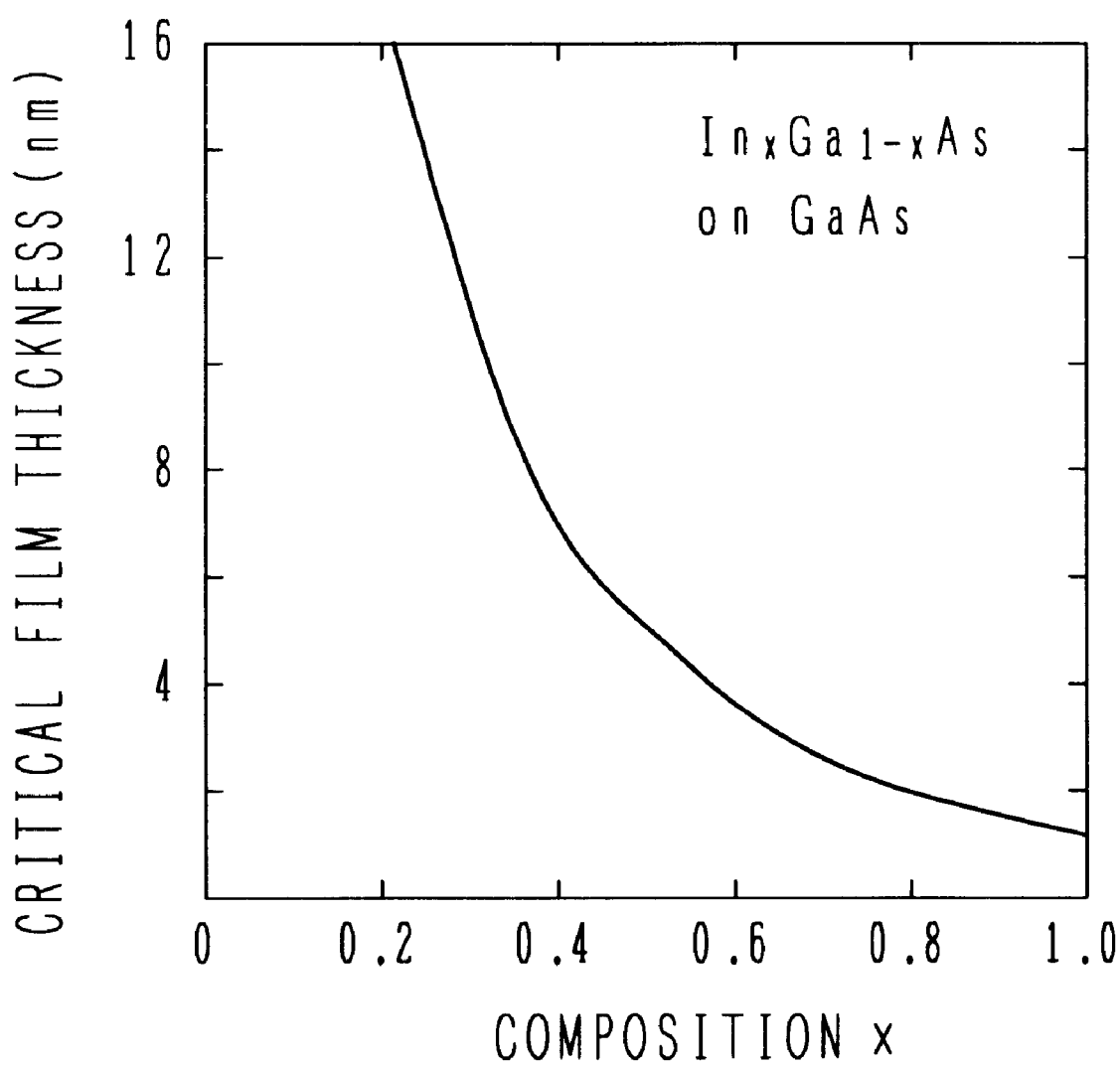
FIG. 6 is a graph showing a calculated critical film thickness of an InGaAs layer sandwiched between GaAs layers, as a function of composition x.

FIG. 6 is a graph showing a calculated critical film thickness of an $In_{1-x}Ga_xAs$ layer sandwiched between GaAs layers, as a function of a composition x (A. Okamoto et al, JJAP, vol. 26, p.539, 1987). As the composition x increases, the critical film thickness $h_c$ becomes thin. For example, if the composition x is 0.3 or higher, the critical film thickness $h_c$ is about 10 nm or thinner.

Figure 1:
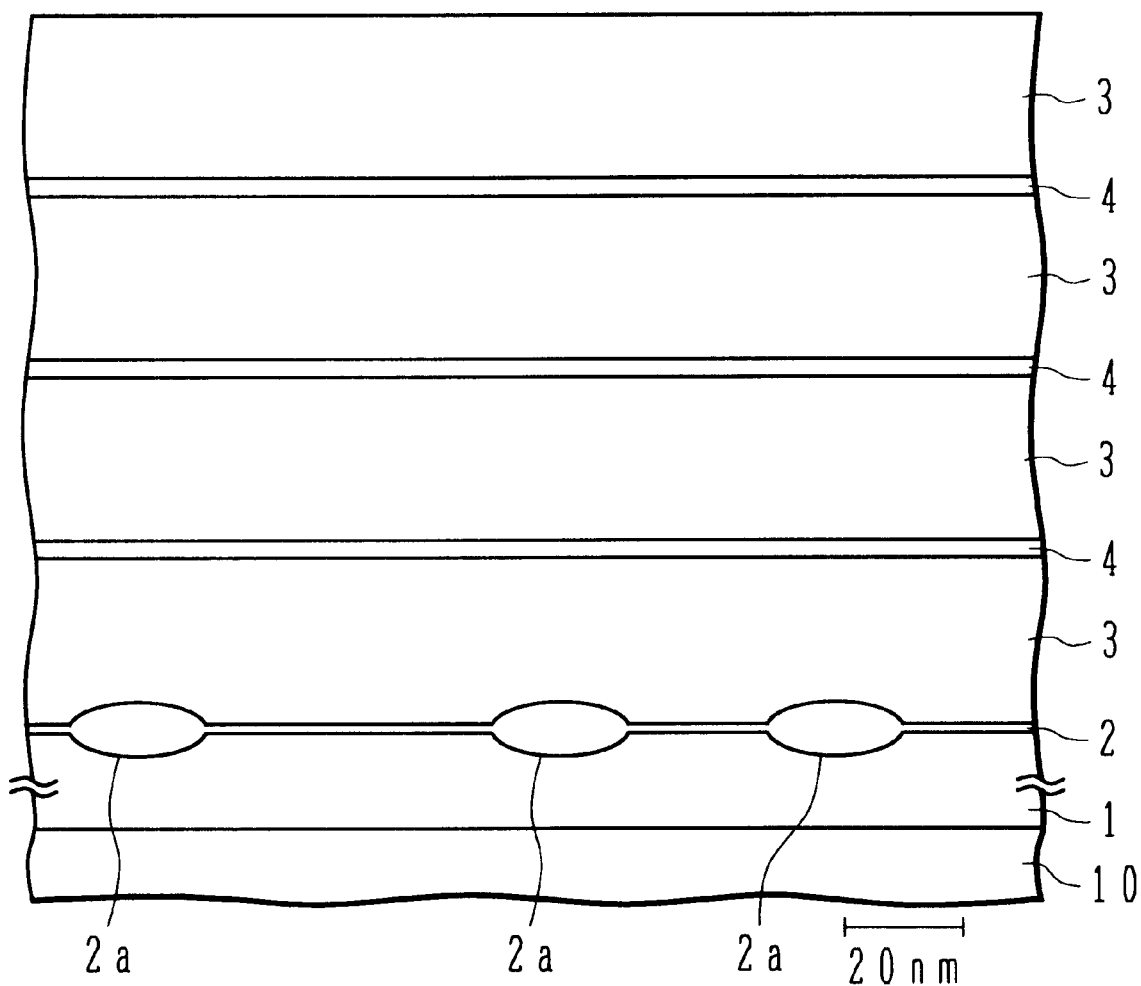
FIG. 1 is a sketch of a TEM photograph of a semiconductor device according to an embodiment of the invention.

With reference to FIG. 1, the structure of a semiconductor device and its manufacture method according to an embodiment of the invention will be described.

FIG. 1 is a sketch of a transmission electron microscope (TEM) photograph of a semiconductor device according to the embodiment of the invention. On a principal surface of a GaAs substrate 10, a GaAs buffer layer 1 of 0.5 μm in thickness is formed. The buffer layer 1 obviously lattice-matches the substrate 10. Since the GaAs buffer layer 1 is sufficiently thicker than each of upper layers, the GaAs substrate 10 is not taken in the TEM photograph.

On the principal surface of the GaAs buffer layer 1, a micro structure 2 made of InGaAs is formed. This micro structure 2 includes a plurality of island regions 2a dispersively distributed. In FIG. 1, the surface of the GaAs buffer layer 1 in the island region 2a is shown depressed because extension of strain field in the crystal is observed. If the semiconductor layers are partitioned in terms of composition, the surface of the GaAs buffer layer 1 is flat.

Sizes of the island regions 2a as viewed along a normal to the substrate surface are different. The largest size is about 50 nm, and an average size is about 20 nm. The surface of the GaAs buffer layer 1 in an area not formed with the island regions 2a is covered with a thin film of InGaAs having a thickness of several atoms. In the island region 2a, it is considered that strain is gradually relaxed at positions remoter from the surface of the GaAs buffer layer 1.

It is considered that the lattice constant of the island region 2a gradually changes from the lattice constant of GaAs to that of InGaAs, at positions from the lower surface of the island region 2a to the upper surface. It is also considered that strain is rarely relaxed in the thin film in an area not formed with the island regions 2a. It is therefore considered that the lattice constant of the thin film along an in-plane direction is almost equal to that of the GaAs buffer layer 1. Although the critical thickness of a film to be formed on this micro structure 2 should be determined on the basis of the lattice constant of the micro structure 2, the lattice constant of the buffer layer may be used as the basis. It is considered that the area of the principal surface occupied by the island regions 2a is preferably 1% or larger.

A spacer layer 3 of GaAs having a thickness of 40 nm and a strained layer 4 of $In_xGa_{1-x}As$ are alternately stacked upon the micro structure 2. A plurality of samples were prepared by changing the composition of the strained layer 4 and the number of layers. The surface of the spacer layer 3 is considered having nearly the lattice constant inherent to GaAs. The strained layer 4 has a large lattice-mismatch relative to the underlying spacer layer.

The GaAs buffer layer 1, GaAs spacer layer 3 and InGaAs strained layer 4 were grown by metal organic vapor phase epitaxy (MOVPE). The growth temperature was set to 525° C., and trimethylindium (TMI), triethylgallium (TEG) and arsine ($AsH_3$) were used as the source materials of In, Ga and As, respectively.

The micro structure 2 may be formed through MOVPE utilizing Stranski-Krastanov mode. If the micro structure 2 is to be made of compound semiconductor as in this embodiment, the micro structure 2 may be formed by supplying a small amount of one group source material and then supplying the other group source material. It can be considered that the one group source material forms droplets on the substrate surface to cause in-plane irregularity. The method of growing the micro structure 2 used in the preparation of semiconductor devices according to the embodiment will be described briefly.

The growth temperature was set to 525° C. Trimethylindium dimethylethylamine aduct (TMIDMEA), TEG and $AsH_3$ were used as the source materials of In, Ga and As, respectively. The micro structure 2 was formed by repeating twelve cycles each cycle supplying each of TMIDMEA, $AsH_3$, TEG and $AsH_3$ in this order. An area of the substrate surface covered with the island regions 2a was 1% or larger.

Figure 2:
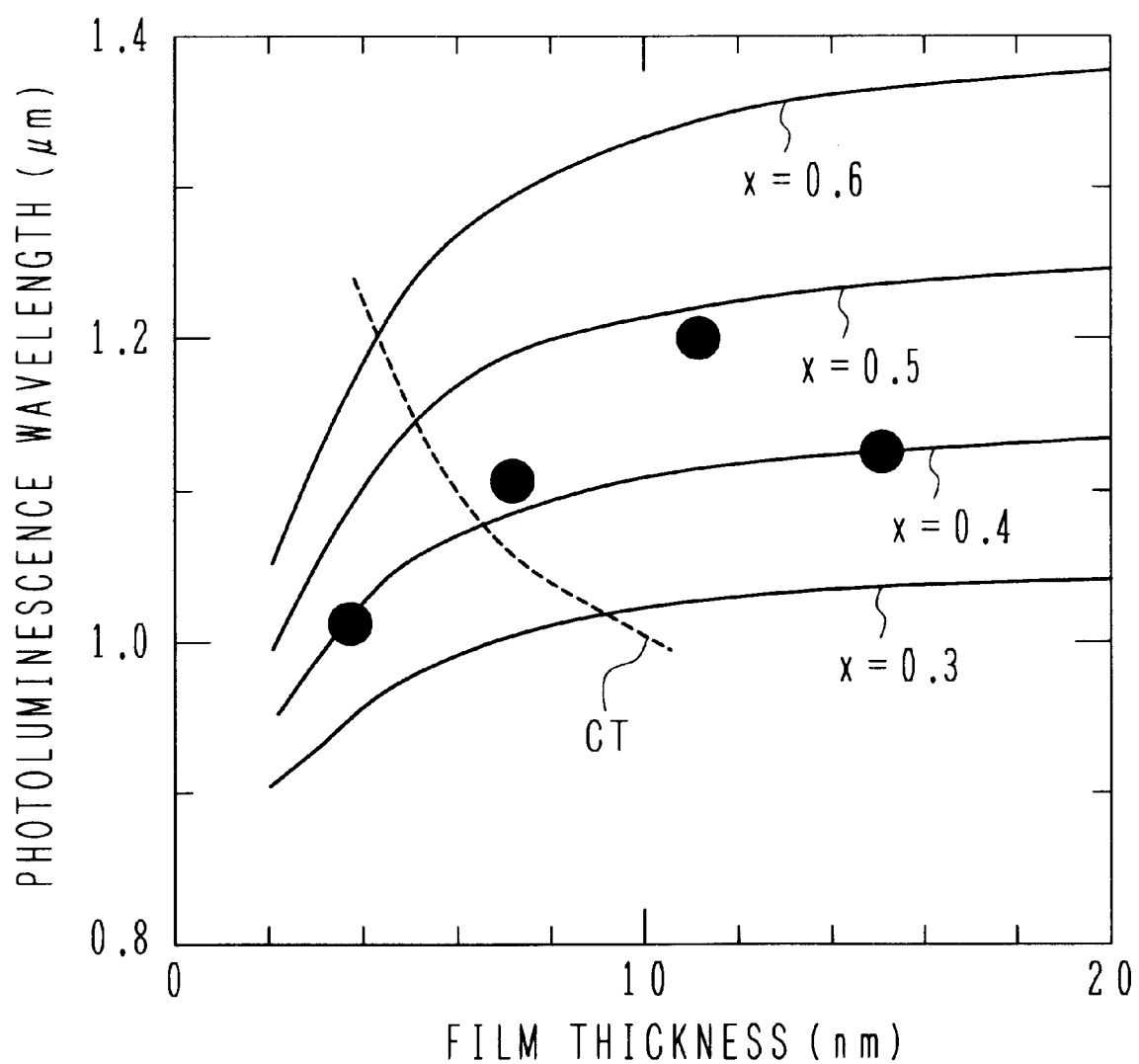
FIG. 2 is a graph showing a relation between a photoluminescence wavelength and a film thickness of an InGaAs layer, and critical film thicknesses.

FIG. 2 is a graph showing a relation between a photoluminescence wavelength and a film thickness of an $In_xGa_{1-x}As$ layer sandwiched between GaAs layers, together with critical film thickness. The abscissa represents a film thickness of an $In_xGa_{1-x}As$ in the unit of "nm", and the ordinate represents a photoluminescence wavelength in the unit of "μm". Four curves shown in FIG. 2 show the calculated results of the relation between the photoluminescence wavelength and film thickness, at the In composition ratios of 0.3, 0.4, 0.5 and 0.6.

Four solid circles in FIG. 2 correspond to four samples having different In composition ratios x and film thicknesses of the InGaAs strained layer of the semiconductor device of the embodiment shown in FIG. 1. The four solid circles are plotted at positions corresponding to the photoluminescence wavelength and In composition ratio of each of the four samples. The photoluminescence wavelength was measured at the sample temperature of 77 K. A thickness of the InGaAs layer of each sample can be known from the abscissa coordinate of the solid circle symbol.

A broken line CT shown in FIG. 2 indicates theoretical critical film thickness when an InGaAs layer is directly grown on a GaAs substrate. As the theoretical film thickness, the equation by Matthews and Blackeslee was used (J. W. Matthews and A. E. Blackeslee, J. Cryst. Growth, vol. 27, p. 118, 1947).

It can be understood from FIG. 2 that an InGaAs layer thicker than the calculated critical film thickness CT can be formed on a GaAs substrate by adopting the embodiment structure of a semiconductor device. Light emission was observed having a wavelength unable to be realized by an InGaAs layer thinner than the critical film thickness.

As described above, the reason why a strained layer thicker than the critical film thickness can be grown by adopting the embodiment structure may be ascribed to the following.

Consider first that an InGaAs strained layer is directly grown on the surface of a GaAs substrate. Crystal strain in a strained layer parallel to the substrate surface pulls a threading dislocation from the substrate. When the strain stress exceeds a tensile force of the dislocation line, a portion of the strained layer slides along the substrate plane direction. As the strained layer slides, the length of the dislocation line elongates and strain energy is released.

In the case of the embodiment structure shown in FIG. 1, it can be considered that the micro structure 2 induces irregularly strained fields in the in-plane direction. These irregularly strained fields form a variation in directions of strain stresses applied to the threading dislocations. For example, vectors of strain stresses may spread radially in the in-plane direction about the center of the island region 2a shown in FIG. 1 or concentrate toward the island region 2a. As compared to the direct growth of a strained layer on a GaAs substrate, a force of sliding the strained layer in the in-plane direction becomes weaker even if the magnitudes of strain stresses are the same. The strained layer is therefore hard to slide.

As described above, by adopting the embodiment structure of a semiconductor device, it is possible to form a strained layer having strains larger than the critical strain amount or a strained layer thicker than the critical film thickness. If the strain amount or thickness is smaller than the critical value, crystallographic stability of the strained layer can be improved by adopting the embodiment structure. The reliability of semiconductor devices can therefore be improved.

In this embodiment, an InGaAs strained layer is formed on a GaAs substrate. The above-described principle making a strained layer difficult to slide does not depend on semiconductor materials and thin film growth method. Therefore, when other materials are used, similar effects to those of this embodiment can be expected by disposing the micro structure between the substrate surface and strained layer.

In this embodiment, although the spacer layer 3 is disposed between the micro structure 2 and strained layer 4 as shown in FIG. 1, the strained layer 4 may be formed directly on the micro structure 2.

Next, with reference to FIGS. 3 and 4, semiconductor lasers utilizing the embodiment structure of a semiconductor lamination will be described.

Figure 3:
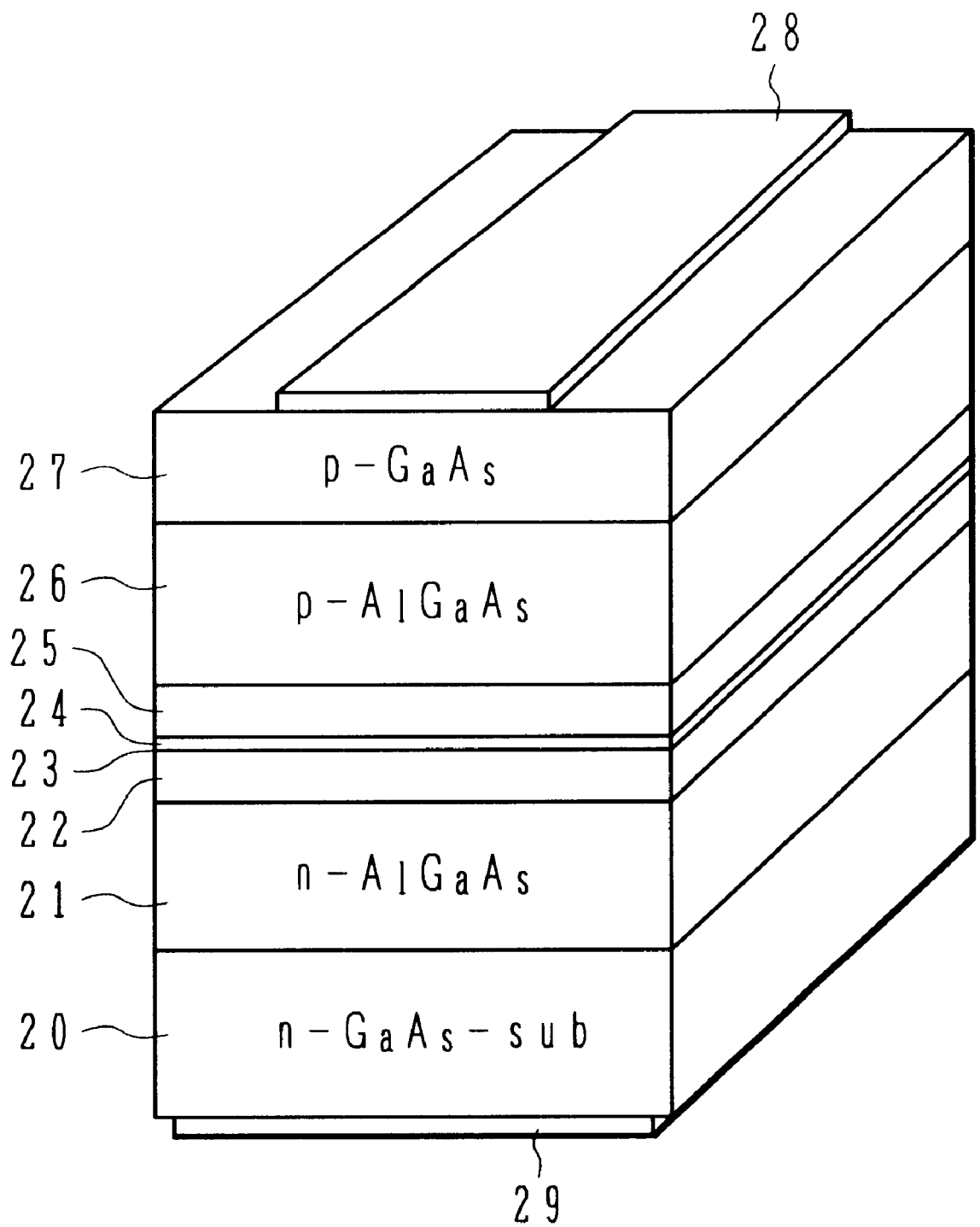
FIG. 3 is a perspective view of a side emission type semiconductor laser adopting the semiconductor device structure of the embodiment.

FIG. 3 is a perspective view of a side emission type semiconductor laser. On the surface of an n-type GaAs substrate 20, an n-type AlGaAs (clad) layer 21 of 1 μm in thickness, a GaAs optical guide layer 22, a micro structure 23, an active layer 24, a GaAs optical guide layer 25, a p-type AlGaAs (clad) layer 26 of 1 μm in thickness and a p-type GaAs layer 27 of 0.5 μm are stacked in this order. The micro structure 23 has the structure similar to the micro structure 2 of the embodiment shown in FIG. 1. The active layer 24 is made of a strained layer of InGaAs. Similar to the embodiment shown in FIG. 1, a GaAs spacer layer may be formed between the micro structure 23 and active layer 24. These semiconductor layers are formed by MOVPE, MBE or the like.

An n-side electrode 29 having a two-layer structure of AuGe/Au is formed on the bottom surface of the n-type GaAs substrate 20. A p-side electrode 28 having a three-layer structure of Ti/Pt/Au is formed on the upper surface of the p-type GaAs layer 27 in the stripe area.

As a forward voltage is applied between the n- and p-side electrodes 29 and 28 and the oscillation conditions are satisfied, a laser oscillation occurs in the active layer 24. As described with reference to FIG. 2, by adopting the embodiment structure, a semiconductor laser of a wavelength longer than the oscillation wavelength limited by the critical film thickness can be obtained.

Figure 4:
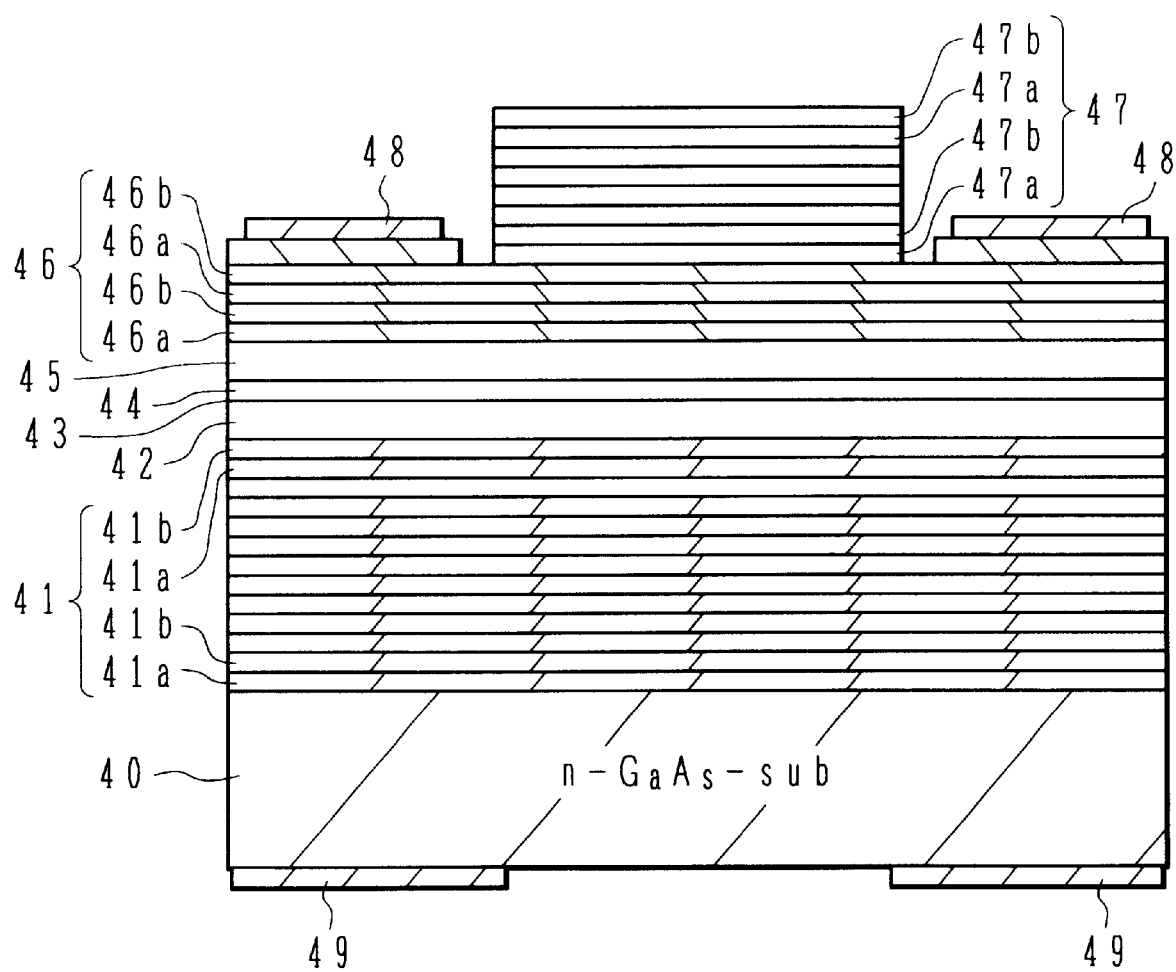
FIG. 4 is a perspective view of a surface emission type semiconductor laser adopting the semiconductor device structure of the embodiment.

FIG. 4 is a cross sectional view of a surface emission type semiconductor laser adopting the embodiment structure of a semiconductor lamination. On the principal surface of an n-type GaAs substrate 40, an n-type mirror layer 41 is formed. The n-type mirror layer 41 has the lamination structure that an n-type InGaAs layer 41a and an n-type GaAs layer 41b having different refractive indices are alternately and repetitively stacked.

On the n-type mirror layer 41, a GaAs layer 42, a micro structure 43, an active layer 44 and a GaAs layer 45 are formed. The micro structure 43 has the structure similar to the micro structure 2 of the embodiment shown in FIG. 1. The active layer 44 is a strained layer made of InGaAs. Similar to the embodiment shown in FIG. 1, a GaAs spacer layer may be disposed between the micro structure 43 and active layer 44.

On the GaAs layer 45, a p-type mirror layer 46 is formed. The p-type mirror layer 46 has the lamination structure that a p-type InGaAs layer 46a and a p-type GaAs layer 46b are alternately and repetitively stacked. An i-type mirror layer 47 is formed on the p-type mirror layer 46 in a partial area thereof. The i-type mirror layer 47 has the lamination structure that a non-doped InGaAs layer 47a and a non-doped GaAs layer 47b are alternately and repetitively stacked.

These semiconductor layers are formed by metal organic vapor phase epitaxy (MOVPE), molecular beam epitaxy (MBE) or the like. The i-type mirror layer 47 is formed by growing the InGaAs layers 47a and GaAs layers 47b over the whole substrate surface and then by patterning this lamination structure. Etching the mirror layer 47 may be performed, for example, by reactive ion etching using chlorine gas.

The n-type mirror layer 41 defines one end of an optical resonator. The p-type mirror layer 46 and i-type mirror layer 47 define the other end of the optical resonator. Each constituent layer of the mirror layer forms an optical length of, for example, λ/4.

A p-side electrode 48 is formed on the p-type mirror layer 46 in an area surrounding the i-type mirror layer 47. An n-side electrode 49 is formed on the bottom of the n-type GaAs substrate 40 in an area corresponding to the p-side electrode 48.

As a forward voltage is applied across the n- and p-side electrodes 49 and 48 and the oscillation conditions are satisfied, a laser oscillation occurs in the optical resonator. As described with reference to FIG. 2, by adopting the embodiment structure, a surface emission type semiconductor laser of a wavelength longer than the oscillation wavelength limited by the critical film thickness can be obtained.

Next, with reference to FIG. 5, a semiconductor device according to another embodiment of the invention will be described.

Figure 5:
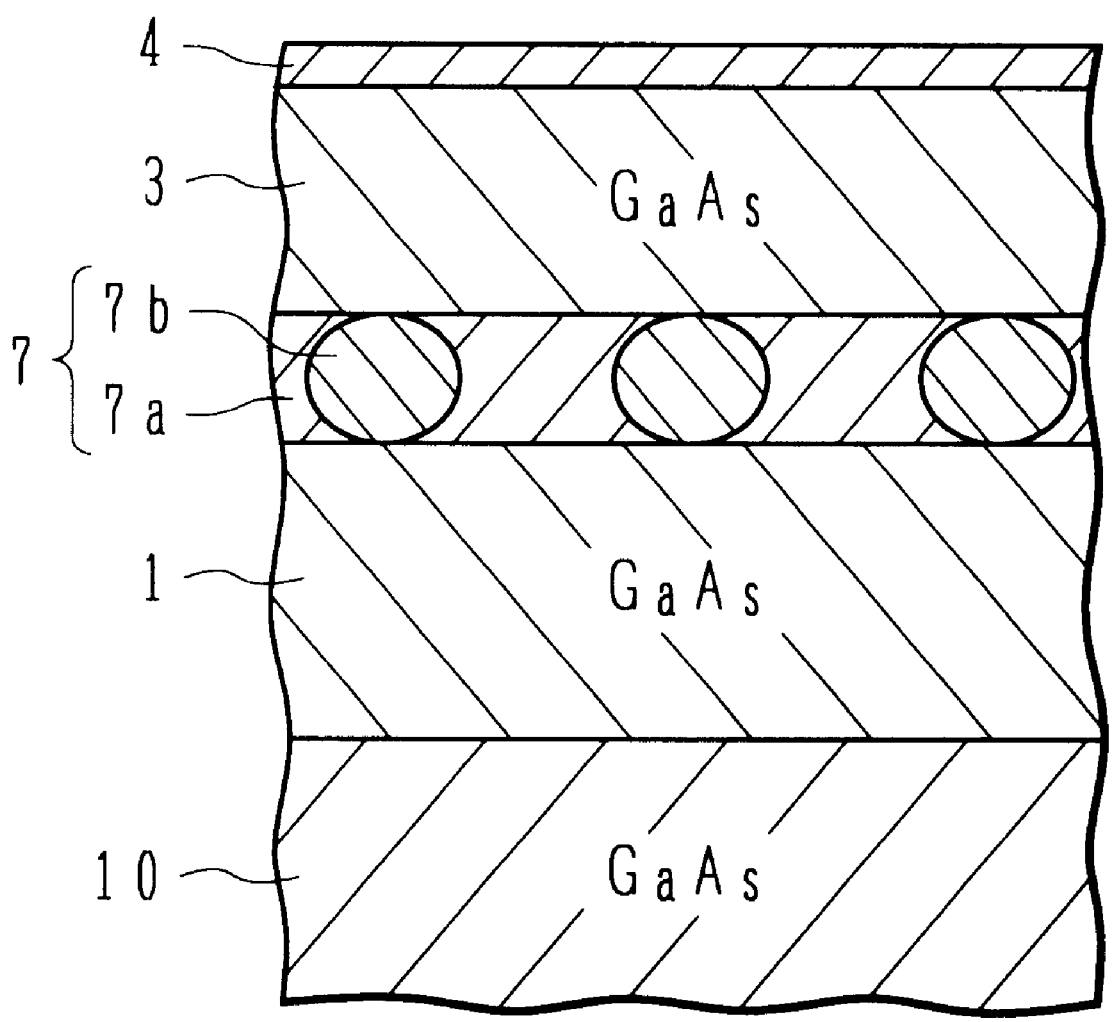
FIG. 5 is a cross sectional view of a semiconductor device according to another embodiment of the invention.

FIG. 5 is a cross sectional view of a semiconductor device of this embodiment. On the surface of a GaAs substrate 10, a GaAs buffer layer 1 is formed. On this GaAs buffer layer 1, a micro structure 7 of InGaAs having a thickness of about 7 nm is formed. On this micro structure 7, a GaAs spacer layer 3 and an InGaAs strained layer 4 are formed.

The micro structure 7 includes a first region 7a covering almost the whole upper surface of the GaAs buffer layer 1, and second regions 7b distributed in the first region 7a in the in-plane area of the substrate. The In composition ratio of the first region 7a is smaller than that in the second region 7b. Namely, strain in the first region 7a is small, whereas strain in the second region 7b is large. The size of the second region 7b in the in-plane direction is about 10 nm. The formation of such a micro structure may be ascribed to that the micro structure 7 having localized strains has the total strain energy lower than that of the InGaAs layer uniformly strained and having a uniform composition ratio.

The method of growing the micro structure 7 shown in FIG. 5 is detailed in JP-A-8-88345 (U.S. Pat. No. 5,608, 229). The growth method described in JP-A-8-88345 will be described briefly.

At a substrate temperature of 460° C., TMIDMEA, trimethylgallium (TMG) and AsH$_3$ are sequentially supplied. Cycle of supplying three kinds of these gases is repeated twelve times to form the final micro structure 7.

It is considered that the lattice constant at the upper surface of the first region 7a is different from that at the upper surface of the second region 7b. Namely, the lattice constant on the upper surface of the micro structure 7 is not uniform in the in-plane direction. It is also considered that the lattice constants of the GaAs substrate 1 and GaAs spacer layer 3 are nearer to the lattice constant of the first region 7a without strain than to the lattice constant of the second region 7b without strain. If the In composition ratio of the first region 7a is sufficiently small, the lattice constant of the first region 7a without strain is expected almost equal to that of the GaAs substrate 1 and GaAs spacer layer 3.

In the embodiment shown in FIG. 5, although the GaAs spacer layer 3 is disposed between the micro structure 7 and strained layer 4, the strained layer 4 may be formed directly on the micro structure 7.

In the above-described embodiments, before the target lattice-mismatching crystal layer is grown, the underlying layer is grown having a three-dimensionally irregular surface area or different lattice constant surface areas. In order to grow such an underlying layer, a semiconductor layer having a lattice constant different from the substrate is used.

The inventors have further studied and found that a crystal layer thicker than the critical film thickness can be grown even if the underlying layer having a different lattice constant from the substrate is not used. Namely, it was found that if a semiconductor layer containing In is grown as the underlying layer, a crystal layer having a thickness in excess of the critical film thickness can be grown without introducing any misfit dislocations.

Figure 7A:
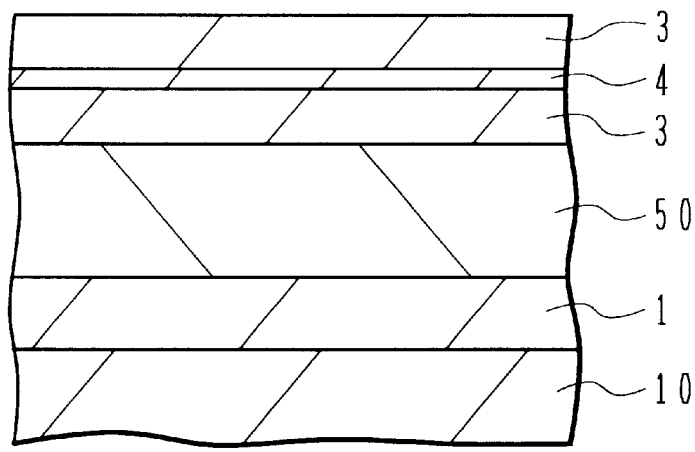
FIGS. 7A and 7B are a cross sectional view showing the structure of samples used for experiments and a graph showing experimental results and calculated values.

FIG. 7A shows the lamination structure of a sample used for the experiments for confirming the above-described phenomenon. Epitaxial growth of the lamination structure was performed through MOVPE at a growth temperature of 670° C. On a GaAs substrate 10, a GaAs buffer layer 1 was grown to a thickness of about 0.5 µm by using TEG and AsH$_3$ as source gases. On this GaAs buffer layer 1, an InGaP layer 50 lattice-matching GaAs was grown to a thickness of about 1.0 µm by using TMI, TEG and PH$_3$ as source gases.

On the InGaP layer 50 lattice-matching the substrate, a GaAs spacer layer 3 was grown to a thickness of about 40 nm by using TEG and AsH$_3$ as source gases and thereafter an InGaAs quantum well layer 4 was grown by using TMI, TMG and AsH$_3$ as source gases. On this InGaAs quantum well layer 4, a GaAs spacer layer 3 was grown to a thickness of about 40 nm. The composition x and thickness of the InGaAs quantum well layer 4 were changed to form several samples.

Figure 7B:
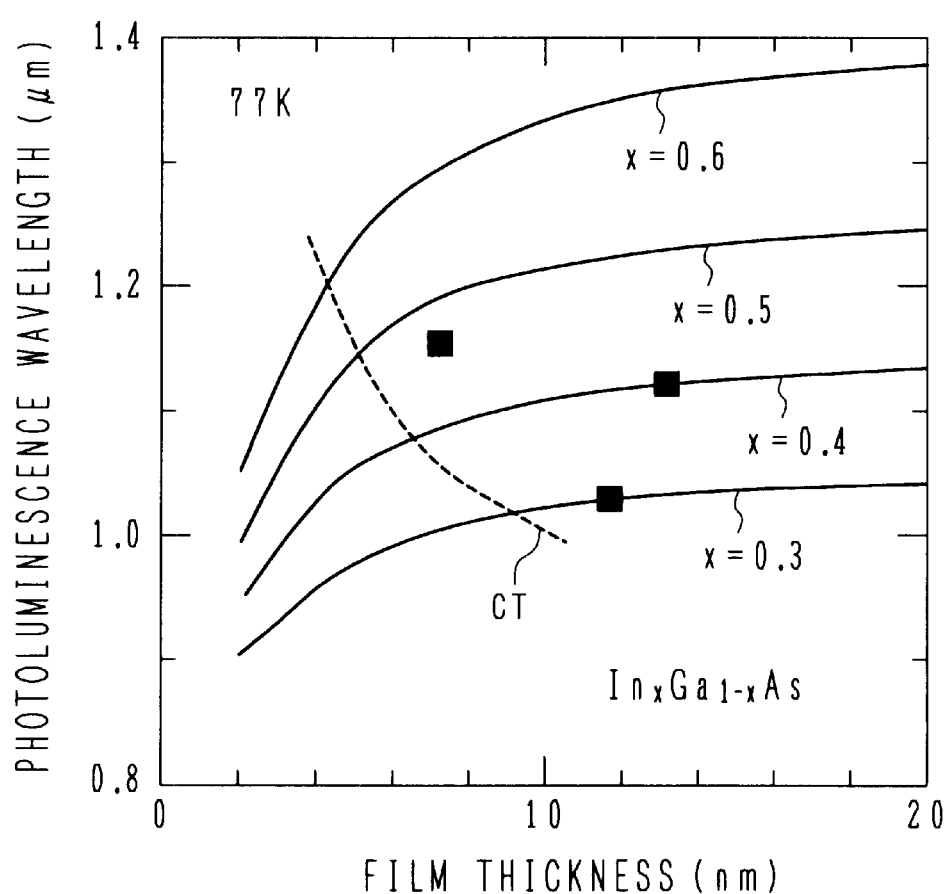

FIG. 7B is a graph showing photoluminescence wavelengths obtained from the samples. The abscissa represents a film thickness of an In$_x$Ga$_{1-x}$As quantum well layer 4 in the unit of nm, and the ordinate represents a photoluminescence wavelength in the unit of µm. The samples maintained at 77 K were measured. Solid squares indicate measurement points. Solid lines indicate emission wavelengths estimated from the theoretical calculations.

As seen from this graph, samples having thicknesses in excess of the critical film thicknesses were grown and indicated emission wavelengths approximately coincident with the theoretical calculations. Namely, it can be understood that crystal layers far more thicker than the critical thicknesses were grown. If the layer having a composition ratio x=0.6 is grown to a thickness of about 7 nm, emission at a wavelength of 1.3 µm is expected. Although the cause of this phenomenon is not still determined, the following assumption may be possible.

In has a tendency very easy to segregate or precipitate on the crystal surface. Namely, if a semiconductor layer containing In is grown, In is likely to segregate or precipitate on the crystal growth surface. This segregated or precipitated In possibly forms a fine composition irregularity. The In composition irregularity on the crystal surface may induce irregular strain fields.

When crystal strain in a strained layer pulls a threading dislocation extending from the substrate and causes the dislocation to slide, irregular strain fields change the direction of strain stress applied to the threading dislocation. It can therefore be considered that even if the same strain stress is generated, the magnitude of a strain vector in a direction parallel to the interface becomes small so that crystal dislocations are difficult to be generated even in excess of the critical strain amount.

According to this assumption, without using a lattice-mismatching growth layer for forming a three-dimensional irregular surface or compositional irregular surface, a crystal layer having a thickness in excess of the critical film thickness is expected to be grown on an underlying layer containing In.

Figure 8A:
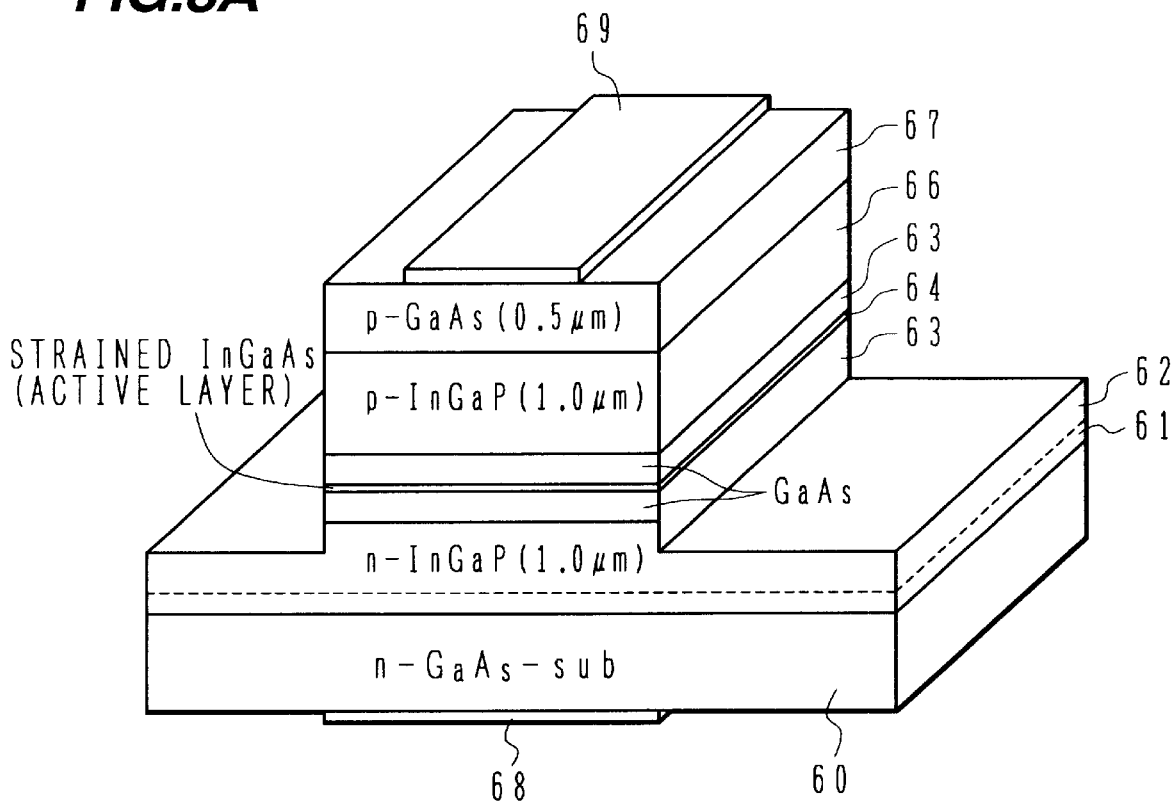
FIGS. 8A and 8B are a perspective view and a cross sectional view showing the structure of a semiconductor device according to an embodiment of the invention.
Figure 8B:
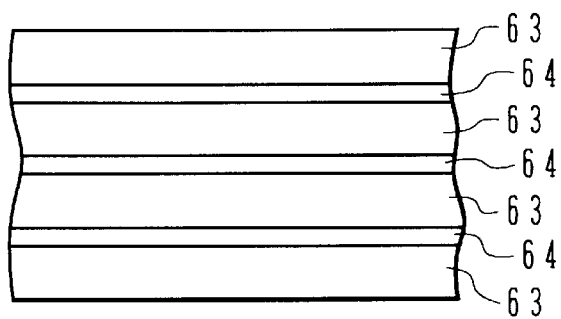

FIGS. 8A and 8B show the structure of a stripe type semiconductor laser according to an embodiment of the invention. Referring to FIG. 8A, on an n-type GaAs substrate 60, a GaAs buffer layer 61 is grown, if necessary. On this GaAs buffer layer 61, an n-type InGaP underlying layer 62 having a composition lattice-matching GaAs is grown to a thickness of, for example, about 1.0 µm. Both the buffer layer 61 and underlying layer 62 are lattice-matching the substrate 60 and the thicknesses thereof can be set as desired.

On the underlying layer 62, a lower GaAs spacer layer 63, an InGaAs strained active layer 64 and an upper GaAs spacer layer 63 are grown. As understood from the above-described experiments, the strained active layer 64 can be grown to a thickness in excess of the critical film thickness. The upper and lower spacer layers 63 on both sides of the strained active layer 64 function as optical guide layers.

On the upper spacer layer 63, a p-type InGaP layer 66 having the composition lattice-matching the GaAs substrate is grown to a thickness of, for example, about 1.0 µm. On this p-type InGaP layer 66, a p-type GaAs layer 67 is grown to a thickness of about 0.5 µm. The n-type InGaP layer 62 and p-type InGaP layer 66 function as clad layers. The p-type GaAs layer 67 functions as a contact layer.

Thereafter, by using a mask of $SiO_2$ or the like on the p-type GaAs layer 67, a stripe lamination is formed through etching. After this etching, the mask is removed. An n-side electrode 68 is formed on the n-type GaAs substrate 60, and a p-side electrode 69 is formed on the p-type GaAs layer 67. The structures of the electrodes are similar to the embodiment described earlier.

In the example shown in FIG. 8A, the active layer is made of the single strained InGaAs layer 64. A multiple quantum well structure may be used by forming a plurality of active layers.

FIG. 8B is a schematic diagram showing the structure of a plurality of active layers (a multiple quantum well structure). On a GaAs spacer layer 63, an InGaAs strained active layer 64 is formed. A plurality of pairs of the spacer layer 63 and strained active layer 64 are formed and thereafter, a spacer layer 63 is formed on the highest level strained active layer 64. With this structure, a multiple quantum well structure having a plurality of active layers can be formed.

Figure 9:
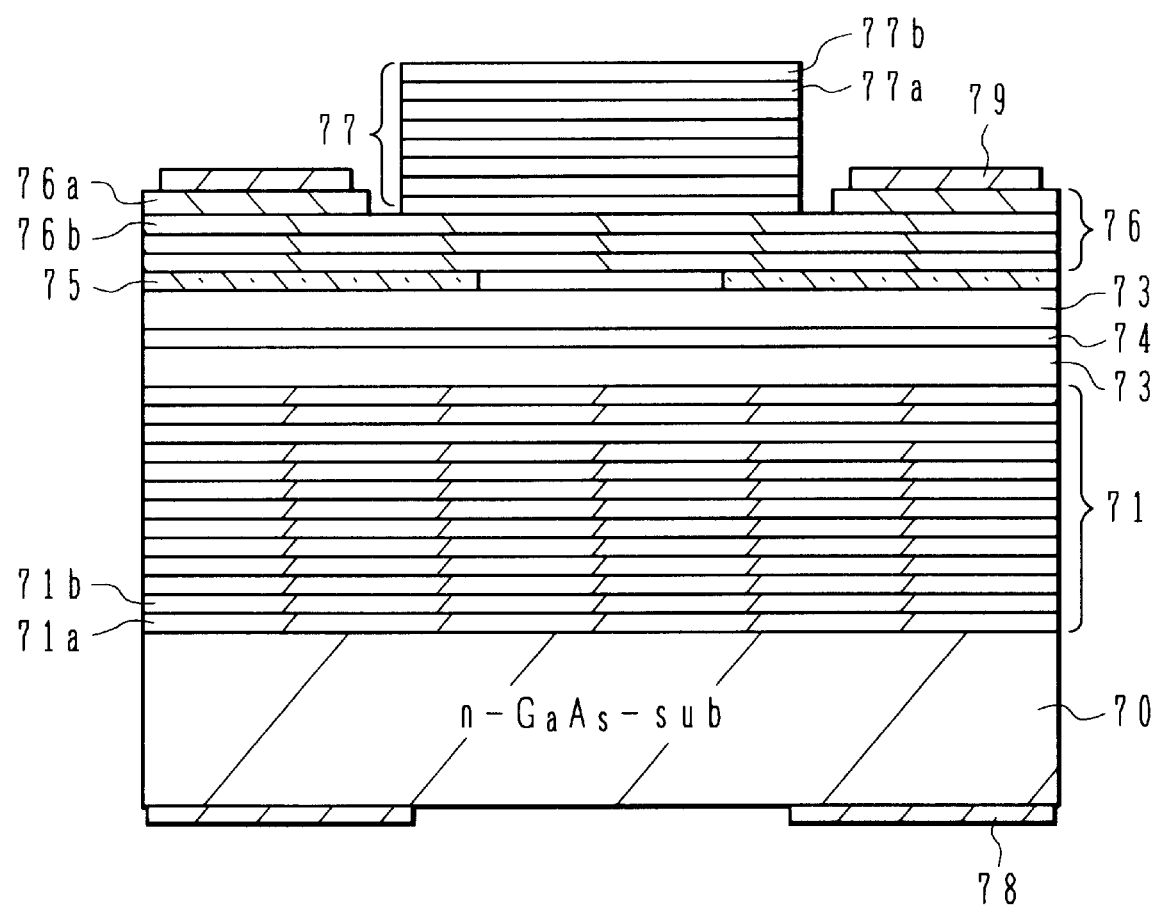
FIG. 9 is a cross sectional view showing the structure of a semiconductor device according to an embodiment of the invention.

FIG. 9 is a schematic diagram showing the structure of a surface emission type semiconductor laser device. On an n-type GaAs substrate 70, a lower mirror structure 71 is formed which is an alternate lamination of an n-type GaAs layer 71a and an n-type InGaP layer 71b having the composition lattice-matching GaAs. This reflection mirror is constituted of a lamination of two kinds of semiconductor layers having different refractive indices. The thickness of each constituent layer of the lower mirror structure 71 has an optical length of λ/4 of the target wavelength.

On the lower mirror structure 71, a lower GaAs spacer layer 73, an InGaAs strained active layer 74 and an upper GaAs spacer layer 73 are stacked to thereby form the active layer and optical guide layers sandwiching the active layer. On the upper spacer layer 73, a p-type mirror structure 76 is formed. For example, the p-type mirror structure 76 is formed by first growing a semiconductor layer 75 containing Al and alternately growing an InGaP layer 76a and a p-type GaAs layer 76b over the semiconductor layer 75.

On the p-type mirror structure 76, an i-type mirror structure 77 is grown. The i-type mirror structure 77 is formed by alternately laminating an i-type InGaP layer 77a and an i-type GaAs layer 77b. The p-type mirror structure 76 and i-type mirror structure 77 constitute an upper mirror structure.

After the crystal growth, heat treatment is executed in high temperature water vapor to oxidize the layer 75 containing Al from its outer periphery and form an aluminum oxide layer. This aluminum oxide layer becomes a current confinement layer. The i-type mirror structure is etched to expose the p-type mirror structure in the nearby area. A p-side electrode 79 is formed on the p-type mirror structure, and an n-side electrode 78 is formed on the peripheral area of the substrate 70. Light emitted in the active layer 74 travels back and forth between the lower and upper mirrors and emits from, for example, the upper and lower surfaces.

In the embodiments described above, the number of misfit dislocations in a semiconductor layer having a large lattice mismatch can be reduced. It is desired to suppress the density of misfit dislocations in the order of $10^{13}/cm^2$ or smaller.

In the above embodiments, although an InGaAs layer is used as the strained active layer, other layers such as an InGaAsP layer, an InGaN layer, an InGaAsSb layer or the like may be used as the strained semiconductor layer. The composition described as a four-element compound is intended to include a three-element compound omitting one element of a plurality of group III or V elements.

In the above embodiments, although an InGaP layer is used as the underlying layer containing In, other layers lattice-matching the substrate, i.e. lattice miss-match in a range of 1% or smaller, may also be used, including an AlGaInP layer, AlGaInAs layer, an AlGaInN layer, an InGaAsP layer and the like. The above relation may be referred to as "lattice-matching in a range of 1% or smaller".

If the difference between lattice constants is 1% or smaller, crystal can be grown with good crystallivity on the underlying crystal layer. A combination of lattice-matching materials described above may be substituted for a combination of materials lattice-matching in a range of 1% or smaller. These lattice constants may also be called equivalent lattice constants.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
    a substrate having a principal surface exposing a first semiconductor material;
    a micro structure disposed on the principal surface of said substrate, said micro structure being made of a second semiconductor material having a lattice constant different from a lattice constant of the first semiconductor material, and defining a three-dimensionally irregular upper surface, said micro structure including island regions of at most 50 nm dispersively distributed on the principal surface of said substrate; and
    a strained active layer disposed on said micro structure, said strained layer being made of a third semiconductor material having a lattice constant different from a lattice constant of an underlying layer and having no dislocations.

2. A semiconductor device according to claim 1, further comprising a spacer layer disposed between said micro structure and said strained active layer, said spacer layer being made of a fourth semiconductor material having a lattice constant equivalent to the lattice constant of the first semiconductor material.

3. A semiconductor device according to claim 1, wherein lattice strain in the island region is relaxed more at a position remoter from the principal surface of said substrate.

4. A semiconductor device according to claim 3, wherein an area of the principal surface of said substrate occupied by the island regions is 1% or larger.

5. A semiconductor device according to claim 1, wherein a thickness of said strained layer is thicker than a critical film thickness of a layer made of the third semiconductor material which can be directly grown on a substrate made of the first semiconductor material.

6. A semiconductor device comprising:
an underlying substrate made of semiconductor material, said underlying substrate having in-plane irregular lattice constants at an upper surface of said underlying substrate; and
a strained active layer formed on the upper surface of said underlying substrate, said strained layer being made of semiconductor material having no dislocations and containing strain.

7. A semiconductor device according to claim 6, wherein the upper surface of said underlying substrate includes a first region having a first lattice constant and second regions distributed in the first region and having a second lattice constant different from the first lattice constant.

8. A semiconductor device according to claim 7, further comprising a spacer layer disposed between the upper surface of said underlying substrate and said strained active layer, said spacer layer being made of semiconductor material having a third lattice constant, the third lattice constant being equal to the first lattice constant or having a value nearer to the first lattice constant than the second lattice constant.

9. A semiconductor device comprising:
a substrate made of a semiconductor material of a first conductivity type;
a micro structure disposed on said substrate, said micro structure having irregular lattice constants at an upper surface of said micro structure and in an in-plane;
a strained active layer disposed on said micro structure, said strained active layer being made of semiconductor material having on dislocations and containing strain;
a clad layer formed on said strained active layer, said clad layer being made of semiconductor material of a second conductivity type, the semiconductor material of the second conductivity type having a lattice constant equivalent to a lattice constant of said substrate; and
electrodes for allowing a current to flow between said substrate and said clad layer.

10. A semiconductor device comprising:
a substrate having a principal surface exposing a first semiconductor material;
an underlying layer disposed on the principal surface of said substrate, said underlying layer being made of a second semiconductor material containing in, the second semiconductor material having a lattice constant which lattice-mismatches a lattice constant of the first semiconductor material in a range of 1% or lower; and
a strained active semiconductor layer disposed on said underlying layer, said strained active semiconductor layer being made of a third semiconductor material having a lattice constant different from a lattice constant of underlying semiconductor material and having no dislocations.

11. A semiconductor device according to claim 10, wherein a thickness of said strained Active semiconductor layer is thicker than a critical film thickness determined by a Matthews-Blakeslee equation.

12. A semiconductor device according to claim 10, further comprising a spacer layer disposed between said underlying layer and said strained active semiconductor layer and made of a fourth semiconductor material having a lattice constant which lattice-matches the lattice constant of the second semiconductor material in a range of 1% or lower.

13. A semiconductor device according to claim 10, wherein misfit dislocations in said strained active semiconductor layer are 1013/cm2 or smaller.

14. A semiconductor device according to claim 10, wherein said strained active semiconductor layer is made of InGaAsP, InGaN or InGaAsSb.

15. A semiconductor device according to claim 10, wherein said underlying layer is made of AlGaInP, AlGaInAs, AlGaInN or InGaAsP.

16. A semiconductor laser comprising:
a substrate having a principal surface exposing a first semiconductor material of a first conductivity type;
an underlying layer disposed on the principal surface of said substrate, said underlying layer including a second semiconductor layer of the first conductivity type containing In, the second semiconductor layer having a lattice constant which lattice-mismatches a lattice constant of the first semiconductor material in a range of 1% or lower;
a lower spacer layer formed on said underlying layer and having a lattice constant which lattice-mismatches the lattice constant of the second semiconductor layer in a range of 1% or lower;
a strained active semiconductor layer disposed on said lower spacer layer, said strained active semiconductor layer including a third semiconductor layer having a lattice constant different from lattice constants of the first semiconductor material and the second semiconductor layer, having no dislocations and being thicker than a critical film thickness determined by a Matthews-Blakeslee equation;
an upper spacer layer formed on said strained semiconductor layer and having a lattice constant which lattice-mismatches the lattice constant of the second semiconductor layer in a range of 1% or lower;
an intermediate layer formed on said upper spacer layer and including a fourth semiconductor layer of a second conductivity type opposite to the first conductivity type, the fourth semiconductor layer having a lattice constant which lattice-matches the lattice constant of the first semiconductor material in a range of 1% or lower; and
electrodes for flowing current between said intermediate layer and said substrate.

17. A semiconductor layer according to claim 16, wherein said lower and upper spacers layers function as optical guide layers for said strained active semiconductor layer, said strained semiconductor layer functions as an active layer, and said underlying layer and said intermediate layer function as clad layers.

18. A semiconductor layer according to claim 16, wherein said underlying layer includes an alternate lamination of the second semiconductor layer and a fifth semiconductor layer having a refractive index different from the second semiconductor layer to form a lower mirror structure, said intermediate layer includes an alternate lamination of the fourth semiconductor layer and a sixth semiconductor layer having a refractive index different from the fourth semiconductor layer to form an upper mirror structure, and the semiconductor laser is a surface emission type semiconductor laser.

19. A semiconductor layer according to claim 16, wherein said strained active semiconductor layer includes an alternate lamination of said underlying layer includes an alternate lamination of the third semiconductor layer and a seventh semiconductor layer having a lattice constant different from the third semiconductor layer to form a multiple quantum well structure.

20. A semiconductor laser comprising:

a substrate made of a semiconductor material of a first conductivity type;

an underlying layer of the first conductivity type disposes on said substrate, said underlying layer either having irregular lattice constants on an upper surface of said underlying layer and in an in-plane or containing In;

a strained active layer disposed on said underlying layer, said strained active layer being made of semiconductor material having no dislocations and containing strain;

a clad layer made of semiconductor material of a second conductivity type opposite to the first conductivity type and formed on said strained active layer, said clad layer having a lattice constant which lattice-mismatches a lattice constant of said substrate in a range of 1% or lower; and electrodes for flowing current between said substrate and said clad layer.

\* \* \* \* \*